United States Patent

Tanaka et al.

Patent Number: 6,061,640
Date of Patent: May 9, 2000

[54] METHOD OF AND APPARATUS FOR EXTRACTING ABNORMAL FACTORS IN A PROCESSING OPERATION

[75] Inventors: Masayuki Tanaka; Katsuyuki Ogawa, both of Yawata, Japan

[73] Assignee: Matsushita Electric Industrial Co., Ltd., Osaka, Japan

[21] Appl. No.: 08/957,919

[22] Filed: Oct. 27, 1997

[30] Foreign Application Priority Data

Oct. 31, 1996 [JP] Japan .................................. 8-290727

[51] Int. Cl.[7] ............................. G06F 17/60; G05B 15/00
[52] U.S. Cl. ............................. 702/81; 702/84; 700/108; 700/109; 700/121
[58] Field of Search ................... 705/7; 702/81, 702/82, 83, 84, 179, 180, 181; 364/468.15, 468.16, 468.17, 468.18, 468.28; 700/108, 109, 110, 111, 121

[56] References Cited

U.S. PATENT DOCUMENTS

| | | | |
|---|---|---|---|
| 5,191,313 | 3/1993 | Galbraith | 340/501 |
| 5,225,998 | 7/1993 | Singhal | 702/84 |
| 5,257,206 | 10/1993 | Hanson | 364/528.08 |
| 5,311,759 | 5/1994 | Mangrulkar et al. | 702/84 |
| 5,339,257 | 8/1994 | Layden et al. | 702/84 |
| 5,351,202 | 9/1994 | Kurtzberg et al. | 702/81 |
| 5,408,405 | 4/1995 | Mozumder et al. | 702/84 |
| 5,423,199 | 6/1995 | Mangrulkar | 702/81 |
| 5,440,478 | 8/1995 | Fisher et al. | 364/468.16 |
| 5,442,562 | 8/1995 | Hopkins et al. | 364/468.15 |
| 5,532,941 | 7/1996 | Lin | 702/84 |
| 5,815,397 | 9/1998 | Saito et al. | 364/468.16 |
| 5,862,054 | 1/1999 | Li | 364/468.28 |

OTHER PUBLICATIONS

Joseph M. Juran, "Quality Control Handbook", McGraw–Hill Book Company, Third Edition (1974), Chapter 9 (pp. 9–1 to 9–51), Chapter 23 (pp. 23–1 to 23–35), and Chapter 41 (pp. 41–1 to 41–21).

Harvard Business School Publication 9–686–118, "Constructing and Using Process Control Charts for Statistical Process Control", Revised Oct. 1987, pp. 1–17.

Emmanuel P. Papadakis, "On–Line Statistical Process Control with NDE and Computers", 1988 IEEE Ultrasonics Symposium, pp. 523–527.

Martin et al., "Process performance monitoring using multivariate statistical process control", IEE Proceecings on Control Theory and Applications, vol. 143, No. 2, Mar. 1996.

Extract of Japanese book entitled, "Multivariate Data Analysis," by Takao Enkawa, Apr. 25, 1988, pp. 22–23, and translation of one paragraph thereof.

Primary Examiner—Eric W. Stamber
Attorney, Agent, or Firm—Price, Gess & Ubell

[57] ABSTRACT

Factors which are adversely affecting a specific quality of products are extracted promptly and easily for common use by analyzing the causal relation between product quality data and quality affecting data. The apparatus comprises a memory unit 2 for saving the product quality data and the data which may adversely affect the product quality detected during a processing operation such as a diffusion process at a semiconductor plant, and a multistage multivariate analysis unit 4 for analyzing the relationship between the quality data as object variables and the quality affecting data as explanation variable saved in the memory unit 2. The analysis is conducted at multiple stages to reduce the number of the explanation variables to a fixed number so that possible abnormal items (explanation variables) are automatically screened at each stage, until the abnormal factors are extracted at the last stage.

8 Claims, 9 Drawing Sheets

METHOD OF AND APPARATUS FOR EXTRACTING ABNORMAL FACTORS IN A PROCESSING OPERATION

BACKGROUND OF THE INVENTION

1. Technical Field of the Invention

The present invention relates to a method of and apparatus for extracting abnormal factors in a processing operation for analyzing the causes of decline in the yield of products due to defects in producing apparatuses and conditions.

2. Description of Related Art

Generally, in a processing operation such as a diffusion process in a semiconductor producing plant, data on producing apparatus histories, producing conditions, and in-line measurement values are collected and stored, and in a following inspection process, data on quality results of products such as the yield of products and their electric characteristics are collected and controlled.

There has been no effective means for analyzing the causal relation between the product quality results information and other information which affects the quality of products such as apparatus history data, producing conditions and in-line measurement values. When it is detected that the yield is declining in the inspection process, an operator has to spot the cause by guesswork based on his experience, which may be not always correct.

There have thus been a need of providing a method for detecting the causes of decline in quality of products at an early stage. Although some methods using a known multivariate analysis method have actually been tried, they still have such disadvantages as described hereinafter.

Firstly, as there are too many items for making an explanation of the variables, the results can hardly reflect actual conditions. Secondly, when producing many kinds of products in a small amount, the quantity of data is much too little for conducting proper analysis. Thirdly, the time required for searching the desired data to explain the causes and for preliminarily processing data to cover missing data prevents an early solution of the causes. Fourthly, the operator is required to have thorough knowledge of a multivariate analysis method, and thus not everyone can easily utilize the method.

BRIEF SUMMARY OF THE INVENTION

In view of the foregoing, it is a primary object of the present invention to provide a method and apparatus for extracting abnormal factors in a processing operation, which is capable of detecting a factor which is adversely affecting a specific quality of products by deducing from the causal relation between the product quality results information and the quality affecting information.

The method of extracting abnormal factors according to the present invention comprises the step of analyzing by means of multistage multivariate analysis a causal relationship between information on quality results of products such as data on yield of products and their electric characteristics, and information on factors which affect the quality of products such as data on apparatus histories, producing conditions, and in-line measurement values, in a processing operation such as a diffusion process in a semiconductor producing plant.

More specifically, the product quality data such as the information on the yield and electric characteristics are represented as object variables while the information which may adversely affect the product quality including apparatus history data, manufacturing condition data, and in-line measurement data are used as explanation variable, to extract abnormal factors with the help of multiple regression analysis. In order to decrease the number of explanation variables used in a formula of the multiple regression analysis, the analysis is made at several stages so as to define the number of the explanation variables to be a specific amount in each stage of analysis. The number of abnormal items (explanation variables) is consequently reduced step by step by a known variable increase and decrease method, to eventually select a certain group of abnormal items which are to be used in the ultimate analysis stage. Abnormal factors can be thereby highly accurately extracted despite the existence of an infinite number of the explanation variables.

In order to implement the above described method, an apparatus for extracting abnormal factors in a processing operation according to the present invention comprises: a memory unit for storing the product quality results data and the data which may adversely affect the quality of products during the processing operation such as a diffusion process in a semiconductor manufacturing plant, and a multistage multivariate analysis means for analyzing the causal relation between the product quality data and the quality affecting data saved in the memory unit.

In particular, the multistage multivariate analysis means comprises a data search unit for searching data which provides object variables and explanation variables used for multiple regression analysis from the memory unit based on inputted parameters, an analysis data preparation unit for preparing analysis data from the retrieved data, an automatic extraction processing unit for extracting abnormal factors by conducting multivariate analysis at multiple stages, an operational data memory unit for saving operational data in an intermediate processing step, and a central processing unit for controlling the above actions.

Other and further objects, features and advantages of the invention will appear more fully from the following description.

DETAILED DESCRIPTION OF THE INVENTION

Preferred embodiments of the present invention will be hereinafter described in conjunction with the accompanying drawings.

Figure 1:
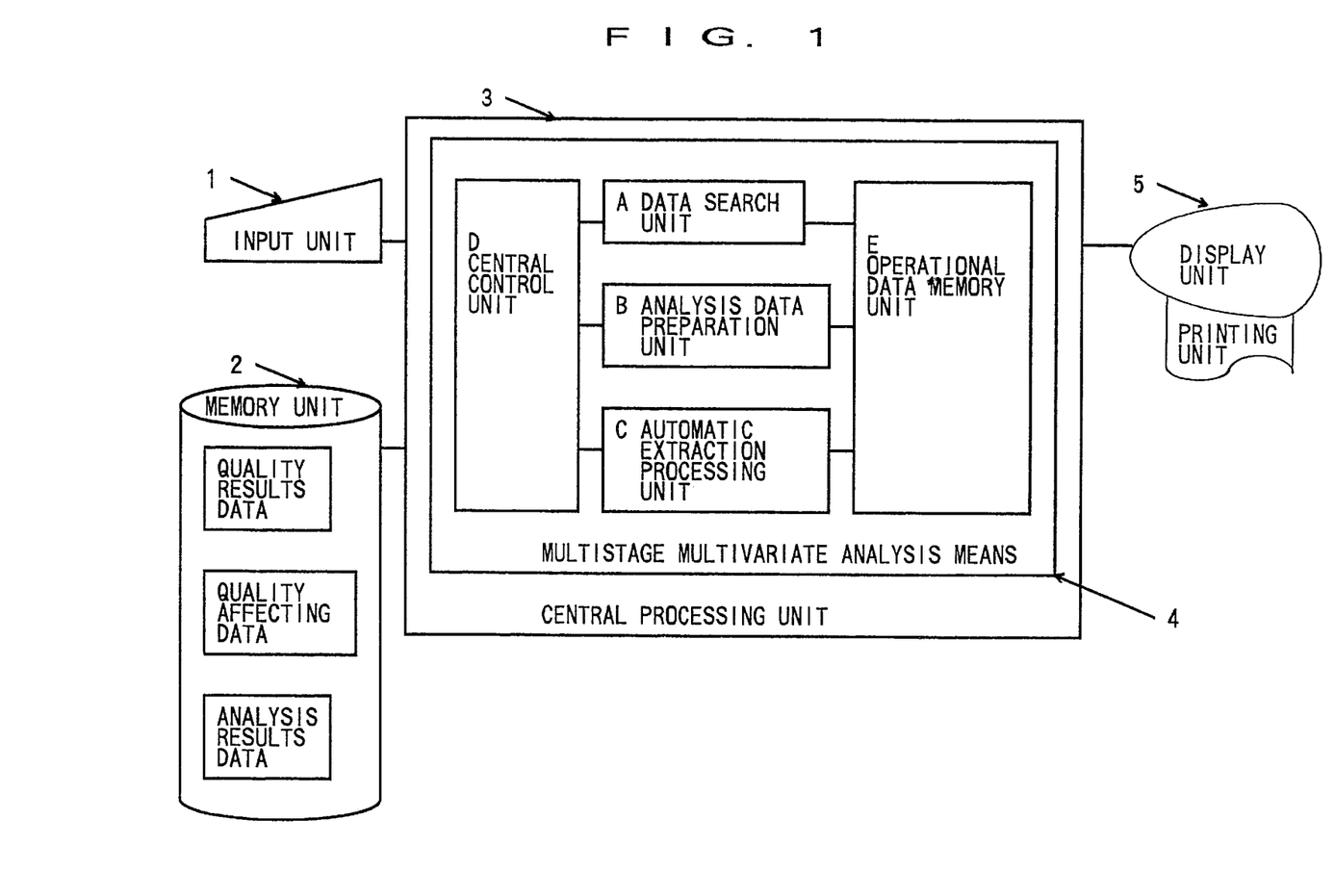
FIG. 1 is a schematic diagram showing a structure of an apparatus for extracting abnormal factors in a processing operation according to one embodiment of the present invention.
Figures 2, 2A:
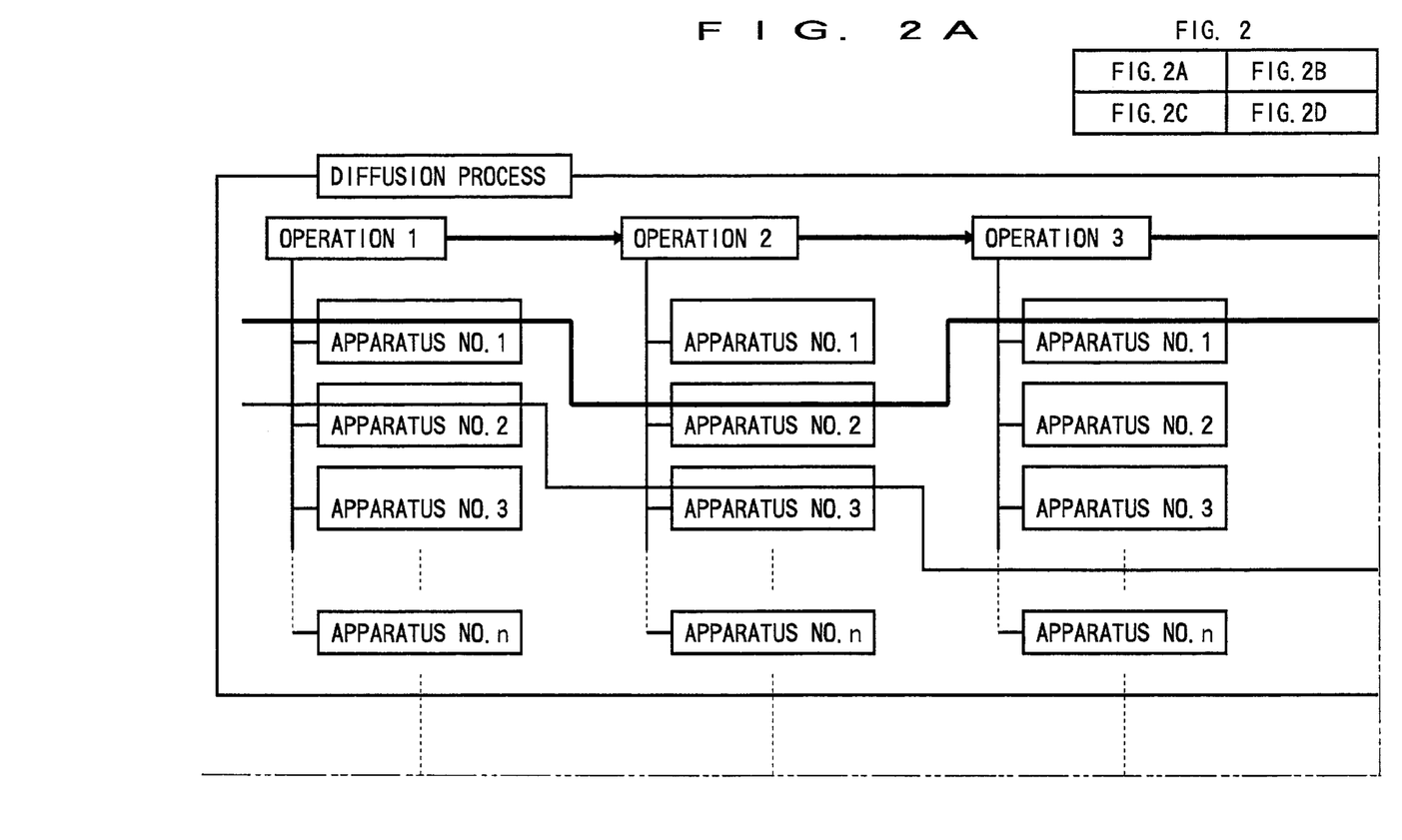
FIGS. 2, 2A, 2B, 2C, and 2D collectively provide a conceptional diagram showing steps of the processing operation in the embodiment of FIG. 1.
Figure 2B:
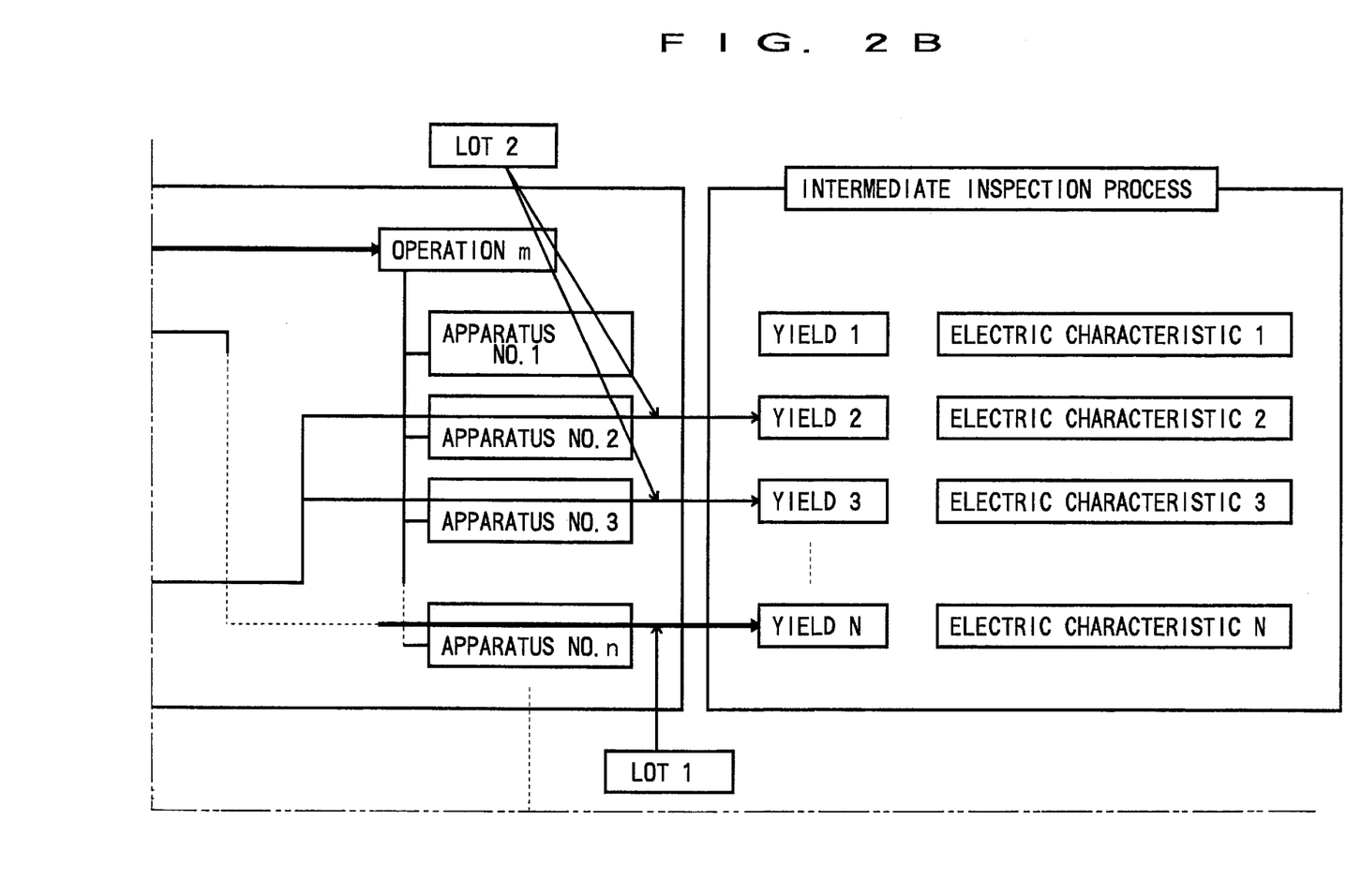
Figure 2C:
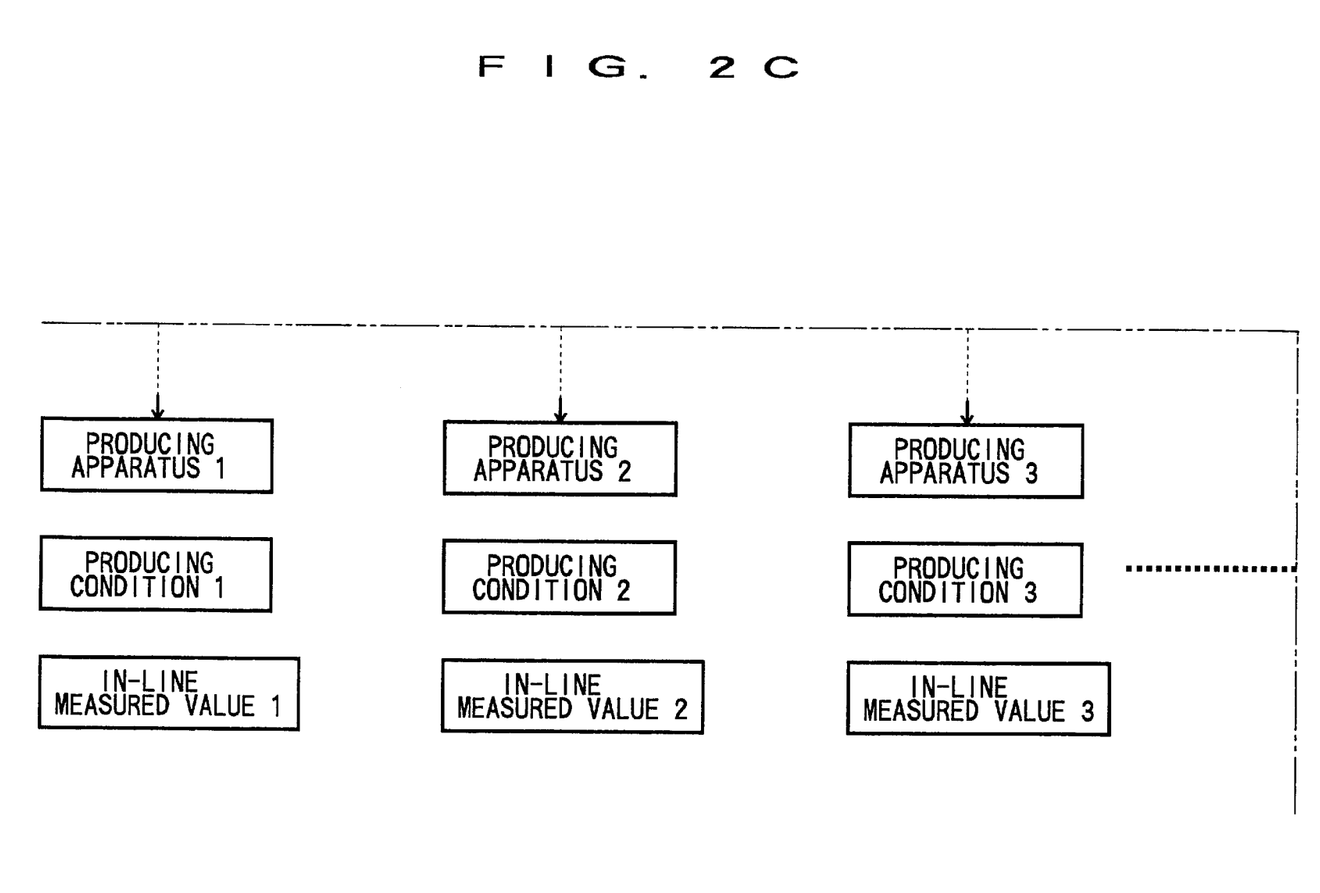
Figure 2D:
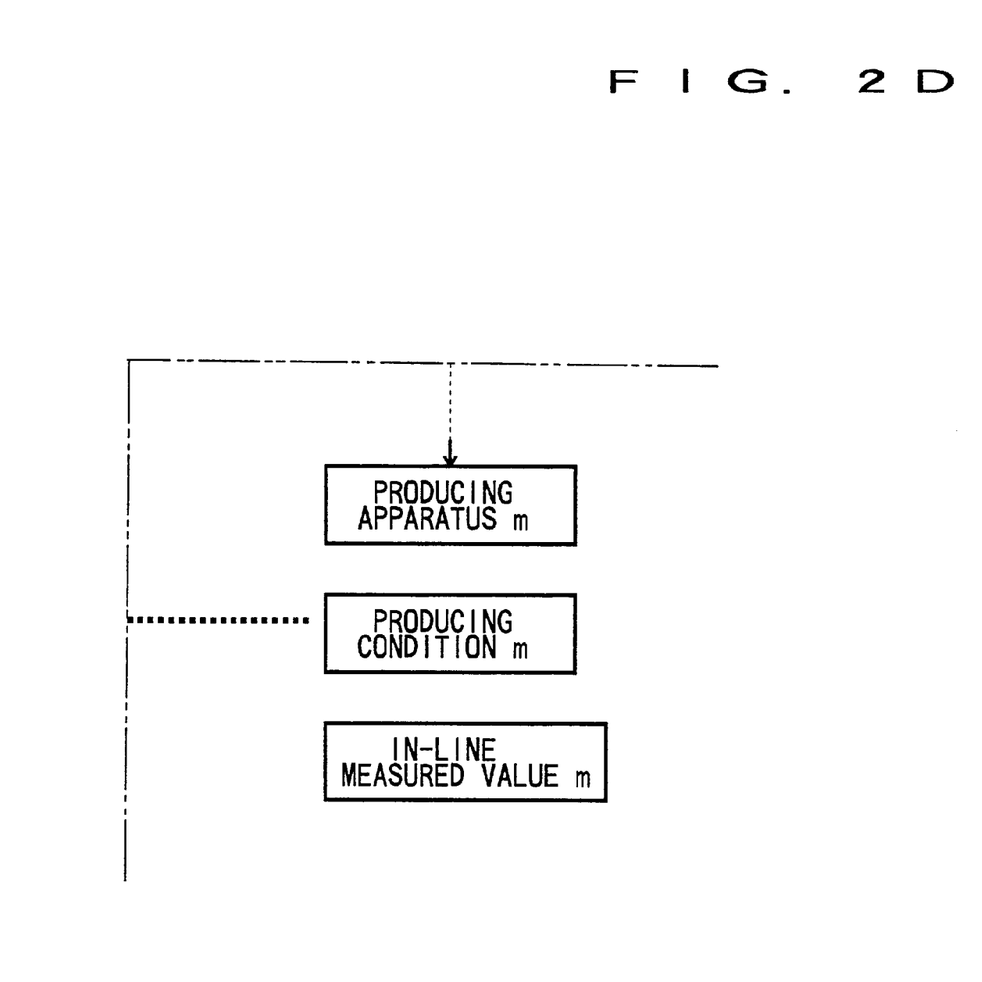

Referring to FIG. 1, reference numerals 1 and 2 respectively denote an inputting unit for inputting parameters required for extracting abnormal factors, and a memory unit for storing data on quality results, quality affecting factors, and analysis results. A central processing unit 3 includes a means 4 for conducting multistage multivariate analysis. There is further provided a displaying and printing device 5 for showing and printing out extraction results.

The multistage multivariate analysis means 4 includes a data search unit A for retrieving necessary data from the memory unit 2, an analysis data preparation unit B for providing data for analysis made from the retrieved data, an automatic extraction processing unit C for extraction of abnormal factors, a central control unit D for controlling these processing operations, and an operational data memory unit E for storing, receiving, and delivering operational data in each processing step.

FIGS. 2, 2A, 2B, 2C, and 2D collectively provide a conceptional diagram of processing operation for which the method and apparatus of the present invention is intended. A product is manufactured through each producing apparatus in each operation in the diffusion process. During this process, the apparatus histories, e.g. as regards which apparatus has manufactured the product, the producing conditions in the operation, and in-line measurement values as the results of each operation are accumulated as the information on factors which may affect the quality of products. The yield of products and electric characteristics are measured as the product quality information in an intermediate inspection step. Lot 1 has only a single producing system while the producing system in lot 2 is divided into different procedures in the diffusion process.

Figure 3:
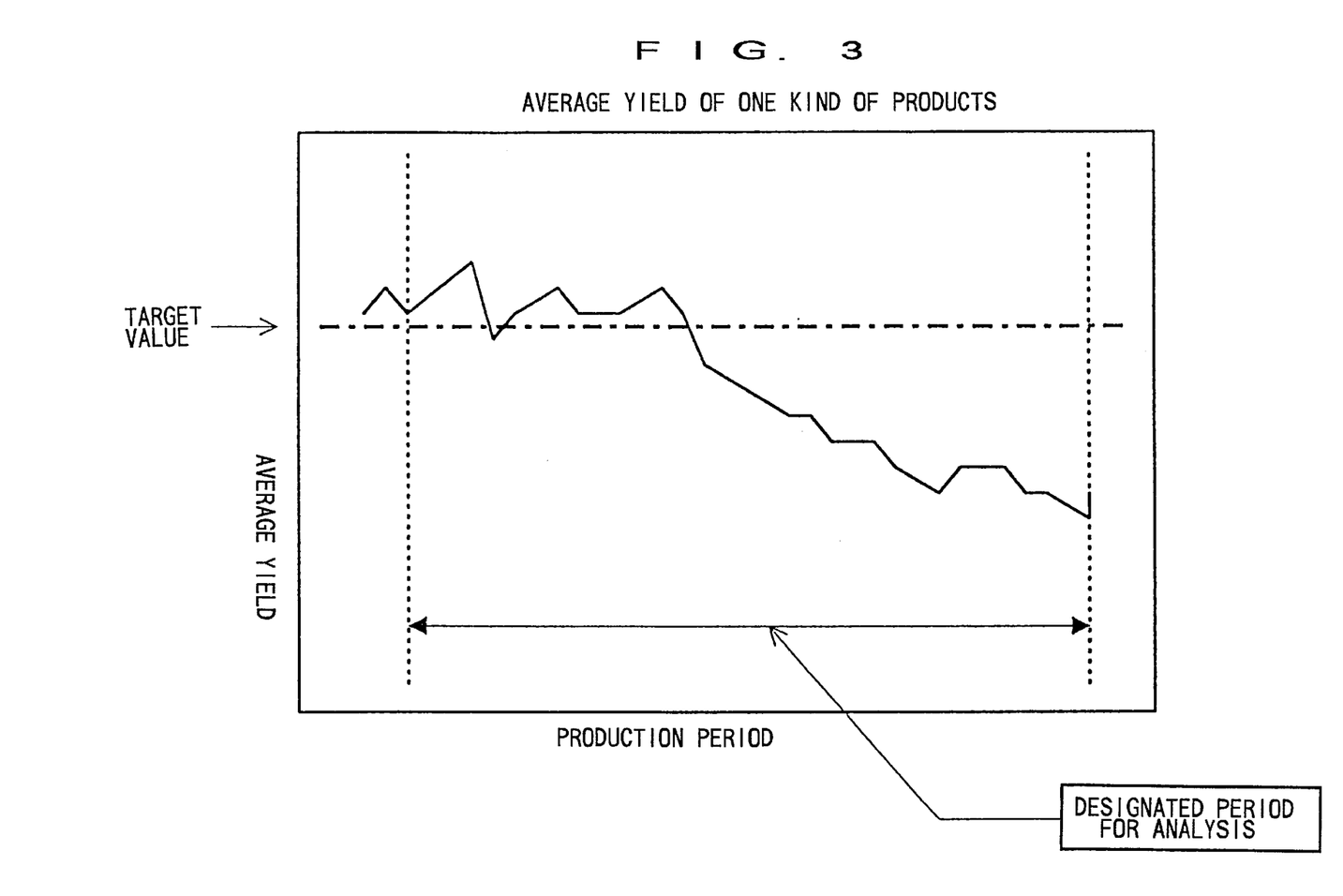
FIG. 3 is an explanatory diagram showing inputted parameters in the embodiment.

When it is detected that an average yield of one kind of products is dropping as shown in FIG. 3, the causal relation between the yield data and the apparatus history data is analyzed and a producing apparatus which is the cause of decline in the yield is spotted in a manner hereinafter described referring to FIGS. 4 to 6.

Figure 4:
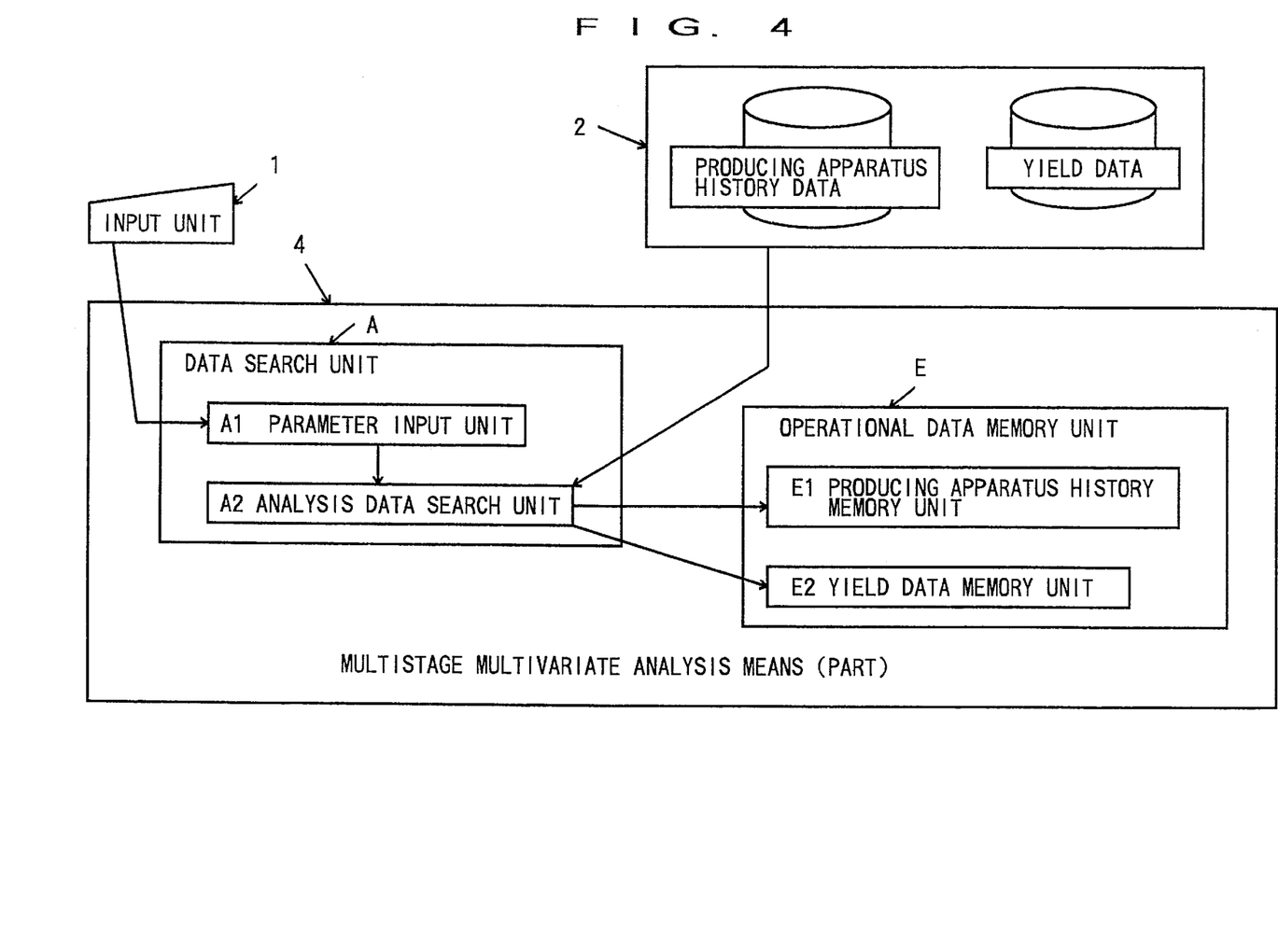
FIG. 4 is a detailed block diagram showing a configuration for data retrieval in the embodiment.

FIG. 4 illustrates a detailed configuration of the data search unit A. Firstly, the period designated for analysis and types of products for which the analysis is intended are inputted as parameters by the input unit 1 to a parameter input unit A1 in the data search unit A. When the product is manufactured in small amount e.g., statistically insufficient, the data on different types of products manufactured with the same conditions is collected to cover the shortage of information. In accordance with the inputted parameters, an analysis data search unit A2 in the data search unit A searches the apparatus history data of the lot 1 accumulated in the diffusion process and the yield data measured in the intermediate inspection process. When the producing system is divided into two procedures as in the lot 2 in the diffusion process, two sets of data may be prepared, each being comprised of combined data on the producing apparatus history and the yield. The prepared data is then stored respectively in a producing apparatus history memory unit E1 and a yield data memory unit E2 in the operational data memory unit E.

Figure 5:
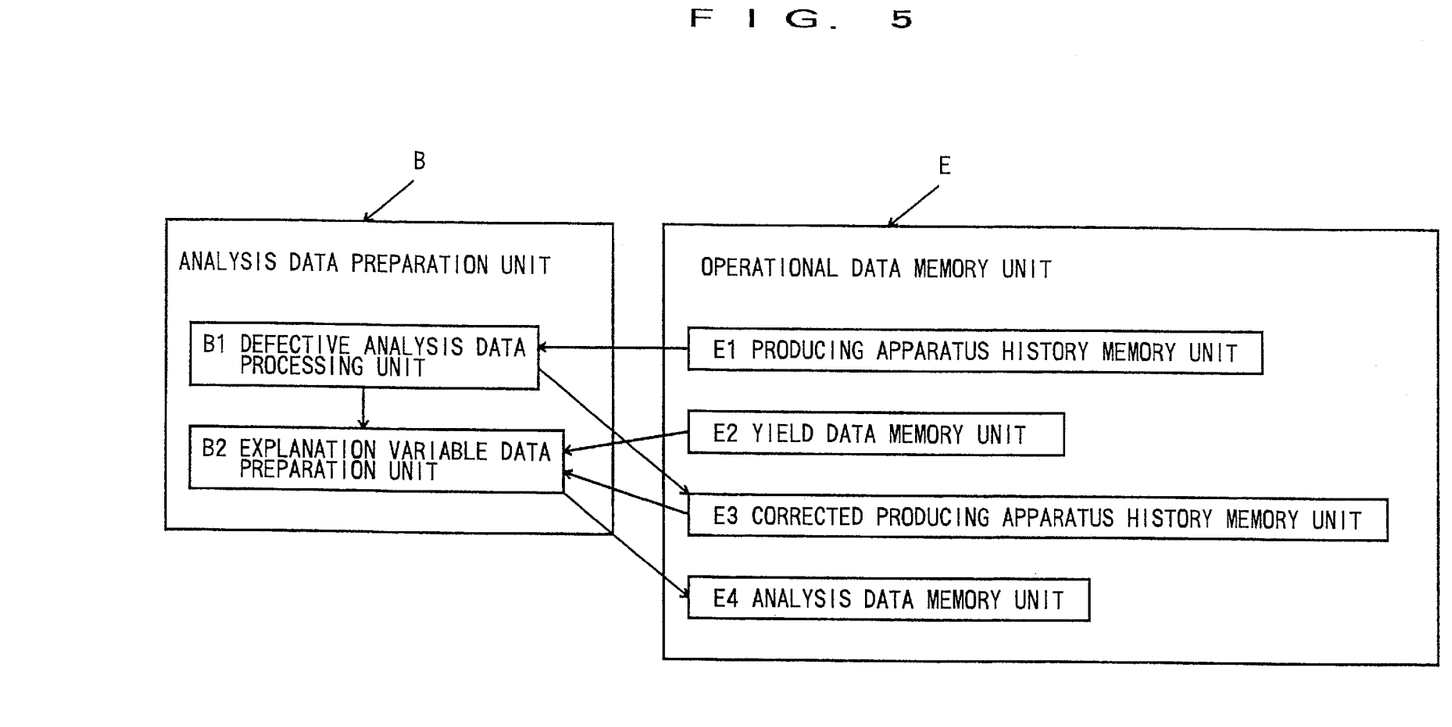
FIG. 5 is a detailed block diagram showing a configuration for analysis data processing in the embodiment.

FIG. 5 shows a detailed configuration of the analysis data preparation unit B. A defective analysis data processing unit B1 checks out whether there is a lack of data on any producing apparatuses in each operation in the diffusion process based on the data retrieved from the producing apparatus history memory unit E. If the data is missing, the corresponding apparatus is hypothetically assumed to exist in order to cover the shortage of data. Further, any items which are unsuitable for analysis such as having only one apparatus are deleted. The amended data is then saved in a corrected producing apparatus history memory unit E3.

An explanation variable data preparation unit B2 extracts a certain number of operations divided from the beginning from the corrected producing apparatus history memory unit E3, and saves the same in an analysis data memory unit E4 in combination with data from the yield data memory unit E2. Similarly, the rest of the operations is divided into groups of a specific number and stored in the analysis data memory unit E4. The operations may be counted from the last one to avoid making a fractional number of operations.

Figure 6:
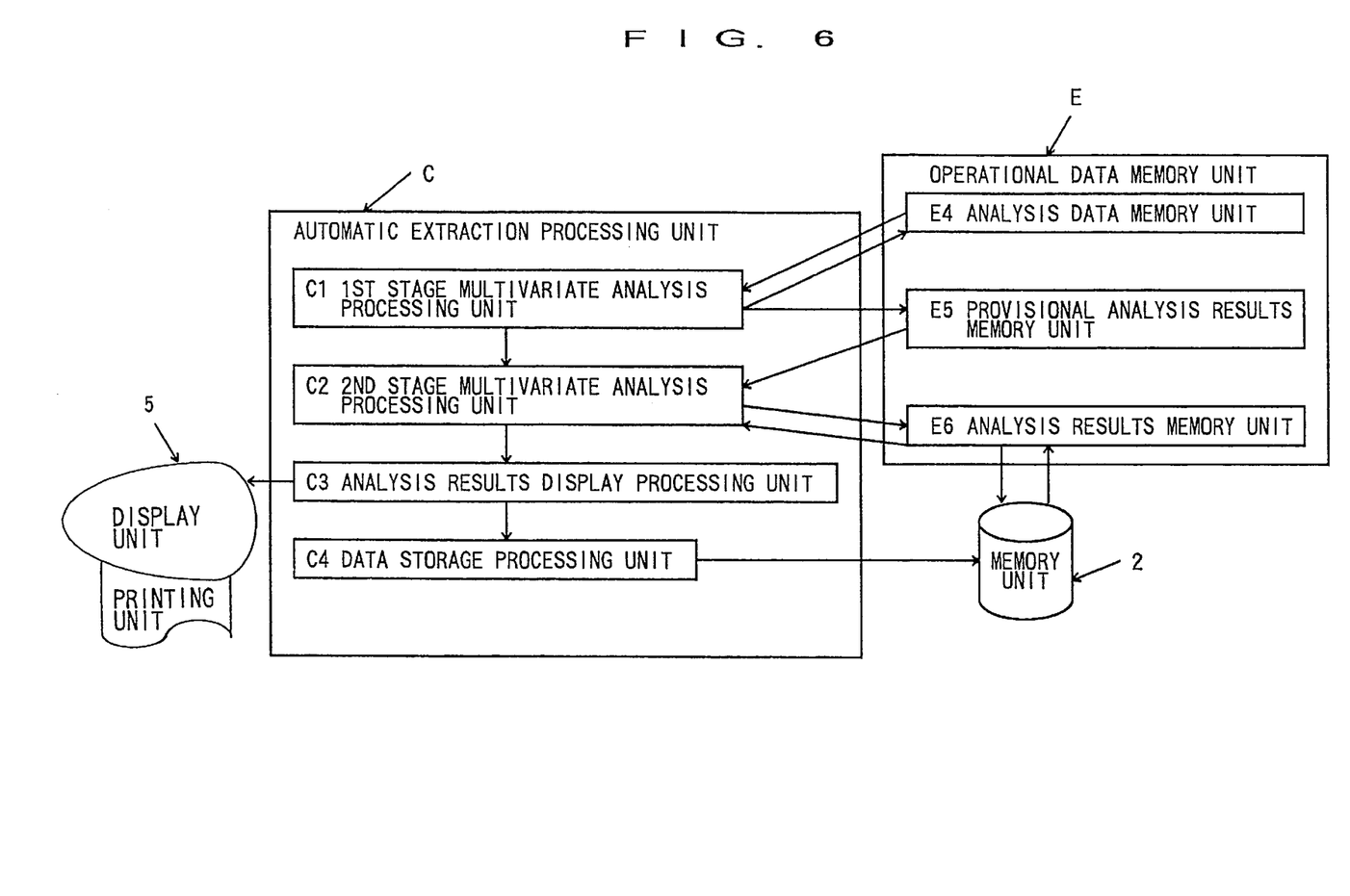
FIG. 6 is a detailed block diagram showing a configuration for automatic extraction processing in the embodiment.

FIG. 6 shows a detailed configuration of the automatic extraction processing unit C. First stage multivariate analysis processing unit C1 reads out data from each group of operations divided as described above from the analysis data memory unit E4 and carries out multiple regression analysis (quantization I) using the yield data as object variables and the apparatus history data as explanation variables.

An operation which has a higher variance ratio F than others is then extracted by a variable increase and decrease method. An operation with a multicollinear error is deleted from the range for analysis so as to enhance the reliability of the data. The results are saved in a provisional analysis results memory unite E5. All of the groups of operations is similarly processed in the first stage multivariate analysis processing unit C1. Nextly, a second stage multivariate analysis processing unit C2 receives the analysis results from the provisional analysis results memory unit E5 and processes the data in the same manner as in the first stage multivariate analysis processing unit C1, extracting and storing a data on the operation with a higher variance ratio F than the others in an analysis results memory unit E6.

An analysis results display processing unit C3 displays the data from the analysis results memory unit E6 with the display/printing unit 5 in the form of a graph showing the values of variance ratio F in each operation, average yields of each producing apparatus, or a graph showing distribution of the yields. A data storage processing unit C4 saves the analysis results and the parameters in the memory unit 2 for providing them for display or reanalysis with modified parameters when required.

Although the embodiment has been described as an apparatus for extracting a producing apparatus which is the cause of decline in the yield of products by analyzing the causal relation between the yield data and the producing apparatus history data, various other information may be used for analysis such as data on electric characteristics instead of the yield data, or data on producing conditions or in-line measurement values instead of the apparatus history data. Depending on cases, qualitative variables are dealt with quantization I while quantitative variables are handled with multiple regression analysis.

As set forth above, according to a method and apparatus for extracting abnormal factors in a processing operation, when the deterioration of product quality is detected in a processing operation comprised of intricate manufacturing processes such as a diffusion process in a semiconductor manufacturing plant, analysis of the causal relation between the quality results and the quality affecting factors can be quickly and effectively conducted by anyone to extract the source of the decline in product quality.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A method of extracting abnormal factors in a processing operation for a diffusion process in a semiconductor manufacturing plant for producing electrical products, comprising the steps of:

collecting and storing data on product quality including yield and electric characteristics;

collecting and storing data on the processing operation which affects the product quality including producing apparatus histories, producing conditions and in-line measurement values;

processing the stored data in preparation for an analysis, including determining when the producing apparatus histories data has a statistically insufficient amount of production information data for a product and preparing a correspondingly corrected producing apparatus histories data; and analyzing a causal relation between the data on product quality and the processing operation data which affects the product quality with a multistage multivariate analysis procedure including extracting a predetermined number of production operations from the corrected apparatus history data to form a first group of a specific number and for forming a second group of production operations of the producing apparatus histories data of apparatus having a statistically adequate amount of production history data, wherein a first stage multivariate analysis procedure reads out data from the first and second groups of production operations using the yield data as object variables to extract a limited number of abnormal factors.

2. A method of extracting abnormal factors in a processing operation according to claim 1, wherein the step of processing the stored data includes the step of gathering data on several different types of products which are manufactured under the same processing operation conditions and the step of preparing the corrected producing apparatus histories data includes using the data collected on several different types of products when such data is statistically sufficient.

3. An apparatus for extracting abnormal factors in a processing operation in a semiconductor manufacturing plant having producing apparatus, comprising:

a memory unit for storing data on product quality including yield and processing operation data including producing apparatus histories which affect the product quality; and a multistage multivariate analysis unit for analyzing a causal relation between the data on product quality and the processing operation data which includes a data search unit for searching data from the memory unit based on inputted parameters to obtain object variables and explanation variables for conducting a multiple regression analysis to repeatedly extract a progressively limited number of abnormal factors;

an analysis data preparation unit for processing the data retrieved from the memory unit and preparing the data in a suitable form for analysis;

an automatic extraction processing unit for processing the data from the analysis data preparation unit at multiple stages by conducting a multivariate analysis to extract abnormal factors;

an operational data memory unit for temporarily storing data being processed; and a central control unit for coordinating the extraction of abnormal factors by controlling the memory unit, the multistage multivariate analysis unit, data search unit, analysis data preparation unit and operational data memory unit.

4. A quality control system for monitoring a production line, which produces a plurality of products, comprising:

means for measuring and storing variable operating condition data of the production line during operation;

means for measuring and storing quality control characteristic data of each one of the plurality of products actually produced on the production line;

means for storing a target production value relative to each one of the plurality of products;

a computer system having a stored multivariate analysis program for determining a causal relationship between a quality control characteristic of each one of the plurality of products and the operating condition of the production line, including a data search unit for searching for stored operating condition data and stored quality control characteristic data to generate object variables and explanation variables, an automatic extraction processing unit for extracting abnormal factors by subjecting the operating condition data and the quality control characteristic data to a multivariate analysis procedure at multiple stages relative to the target production value, the object variables, and the explanation variables to extract a limited number of abnormal factors; and means for displaying an output of the determination of the causal relationship.

5. The quality control system of claim 4, wherein variable operating condition data includes producing apparatus history data for each apparatus on the production line and the quality control characteristics data includes product yield data for each one of the plurality of products.

6. The quality control system of claim 5 further including a defective analysis data producing unit for determining when the producing apparatus history data for each apparatus that is operated under the same conditions for other products is substituted for a product having a statistically inadequate amount of production information data and storing a corresponding corrected producing apparatus history data for that product.

7. The quality control system of claim 6 further including an explanation variable data preparation unit for extracting a predetermined number of production operations from the stored corrected producing apparatus history data to form a first group of a specific number and for forming a second group of the production operations of the producing apparatus history data of apparatus having a statistically adequate amount of production history data, wherein a first stage multivariate analysis procedure reads out data from the first and second groups of production operations using the yield data as the object variables and the producing apparatus history data as the explanation variables to extract a limited number of abnormal factors.

8. A quality control system for monitoring a semiconductor production line, which produces a plurality of products, comprising:

means for measuring and storing variable operating condition data of the production line during operation including producing apparatus history data for each apparatus on the production line;

means for measuring and storing quality control characteristic data of each one of the plurality of products actually produced on the production line including product yield data for each one of the plurality of products;

means for storing a target production value relative to each one of the plurality of products; and a computer system having a stored multivariate analysis program for determining a causal relationship between a quality control characteristic of each one of the plurality of products and the operating condition of the production line, including a data search unit for searching for stored operating condition data and stored quality control characteristic data to generate object variables and explanation variables, a defective analysis data producing unit for determining when the production apparatus history data for each producing apparatus that is operated under the same conditions for other products is substituted for a product having a statistically inadequate amount of production information data and storing a corresponding corrected producing apparatus history data for that product;

an explanation variable data preparation unit for extracting a predetermined number of production operations from the stored corrected producing apparatus history data to form a first group of a specific number and for forming a second group of the production operations of the production apparatus history data of apparatus having a statistically adequate amount of production history data;

an automatic extraction processing unit for extracting abnormal factors by subjecting the operating condition data and the quality control characteristic data to a multivariate analysis procedure at multiple stages relative to the target production value, the object variables and the explanation variables; and means for producing an output of the determination of the causal relationship, wherein a first stage multivariate analysis procedure reads out data from the first and second groups of production operations using the yield data as the object variables and the producing apparatus history data as the explanation variables to extract a limited number of abnormal factors.

* * * * *